(12) United States Patent
Yang et al.

(10) Patent No.: US 10,659,011 B2
(45) Date of Patent: May 19, 2020

(54) LOW NOISE AMPLIFIER

(71) Applicant: Delta Electronics Int'l (Singapore) Pte Ltd, Singapore (SG)

(72) Inventors: Kaituo Yang, Singapore (SG); Chirn Chye Boon, Singapore (SG); Devrishi Khanna, Singapore (SG); Jack Sheng Kee, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/167,039

(22) Filed: Oct. 22, 2018

(65) Prior Publication Data

US 2020/0127644 A1 Apr. 23, 2020

(51) Int. Cl.
*H03H 19/00* (2006.01)
*H03B 5/12* (2006.01)
*H04B 1/16* (2006.01)
*H03F 1/02* (2006.01)

(52) U.S. Cl.
CPC ......... *H03H 19/004* (2013.01); *H03B 5/1253* (2013.01); *H03F 1/0205* (2013.01); *H04B 1/1638* (2013.01); *H03F 2200/294* (2013.01); *H03F 2200/451* (2013.01); *H03H 2210/025* (2013.01)

(58) Field of Classification Search
CPC ........... H03B 5/00; H03B 5/1253; H03F 1/00; H03F 1/0205; H03F 2200/00; H03F 2200/294; H03F 2200/451; H03F 3/00; H03F 3/005; H03H 11/00; H03H 11/04; H03H 11/1291; H03H 19/00; H03H 19/004; H03H 2210/00; H03H 2210/025; H03K 5/00; H03K 5/249; H04B 1/00; H04B 1/1638
USPC ........................................................ 327/554
See application file for complete search history.

(56) References Cited

U.S. PATENT DOCUMENTS

| 5,892,540 | A | 4/1999 | Kozlowski et al. |
| 7,218,180 | B2 | 5/2007 | Wood |
| 9,374,063 | B1 * | 6/2016 | Mak ..................... H03H 19/004 |
| 2006/0238265 | A1 * | 10/2006 | Soltanian ............... H03L 7/099 331/167 |

FOREIGN PATENT DOCUMENTS

| JP | 4144113 B2 | 9/2008 |
| TW | 200703878 A | 1/2007 |
| TW | 201212550 A | 3/2012 |

* cited by examiner

*Primary Examiner* — Lincoln D Donovan
*Assistant Examiner* — Dave Mattison
(74) *Attorney, Agent, or Firm* — Kirton McConkie; Evan R. Witt

(57) ABSTRACT

A low noise amplifier is provided. The low noise amplifier includes an input port, an output port, an inverter, a plurality of switched-capacitor units and a feedback inductor. The inverter is electrically connected between the input port and the output port. Each of the plural switched-capacitor units is electrically connected with the inverter in parallel and includes a switch and a capacitor connected in series. The feedback inductor is electrically connected with the inverter in parallel.

5 Claims, 4 Drawing Sheets

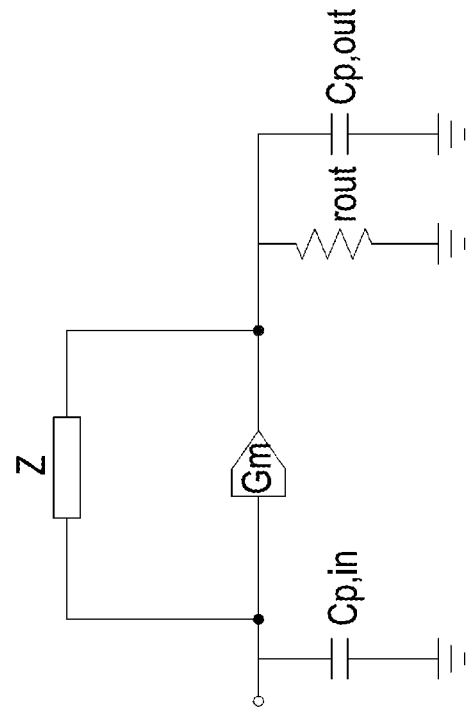
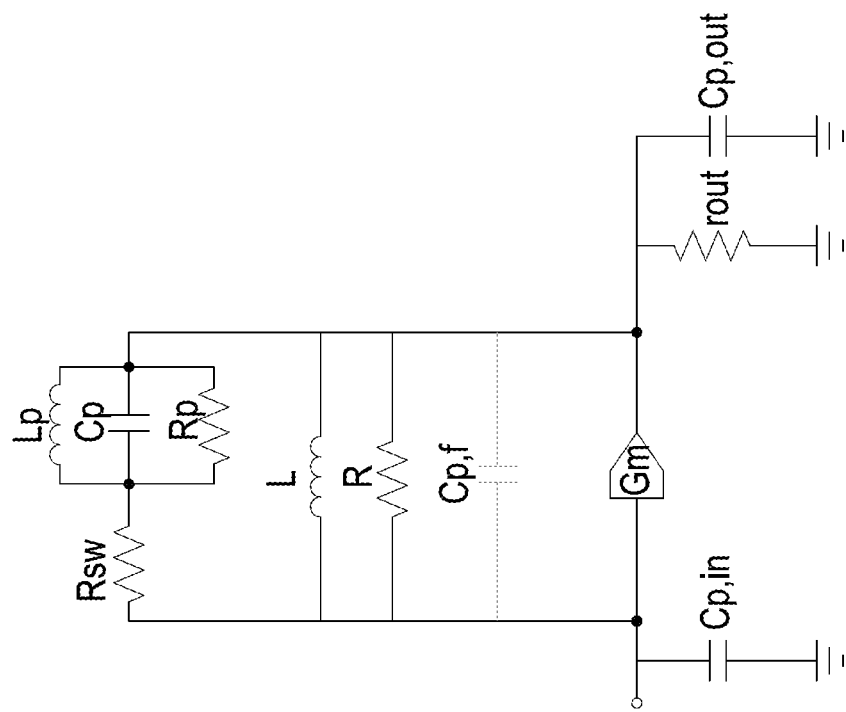
FIG. 3A
FIG. 3B

LOW NOISE AMPLIFIER

FIELD OF THE DISCLOSURE

The present disclosure relates to a low noise amplifier, and more particularly to a low noise amplifier with self correction function for frequency offset.

BACKGROUND OF THE DISCLOSURE

Traditional receiver front-end generally requires external surface acoustic wave (SAW) filters to filter out-of-band blockers and interferences. However, the off-chip components of SAW filter are usually bulky, inflexible and expensive. To decrease cost and form factor while improving integration and system performance, SAW-less receiver front-end has been widely studied and reported in public domain. However, most of them focus on applications below 3 GHz, which is not applicable for higher frequencies, for example, 802.11ac Wireless Local Area Network (WLAN). Moreover, due to ubiquitous parasitic effects, especially parasitic capacitance, the actual working frequency will not be the same as desired. Especially when working at higher frequencies, the working frequency will be shifted downwards a lot.

Therefore, there is a need of providing a low noise amplifier to obviate the drawbacks encountered from the prior arts.

SUMMARY OF THE DISCLOSURE

It is an object of the present disclosure to provide a low noise amplifier. In the low noise amplifier, the feedback inductor is electrically connected with the inverter and the plural switched-capacitor units in parallel. The affection of the parasitic capacitors is balanced by the feedback inductor, and thus the work frequency of the low noise amplifier is kept equal to the center frequency of the plural switched-capacitor units. Consequently, the self correction function for frequency offset is realized, and the low noise amplifier is allowed to work at high frequency.

In accordance with an aspect of the present disclosure, there is provided a low noise amplifier. The low noise amplifier includes an input port, an output port, an inverter, a plurality of switched-capacitor units and a feedback inductor. The inverter is electrically connected between the input port and the output port. Each of the plural switched-capacitor units is electrically connected with the inverter in parallel and includes a switch and a capacitor connected in series. The feedback inductor is electrically connected with the inverter in parallel.

BRIEF DESCRIPTION OF THE DRAWINGS

FIGS. 3A and 3B are schematic diagrams illustrating equivalent circuits of the low noise amplifier of FIG. 1;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 2:
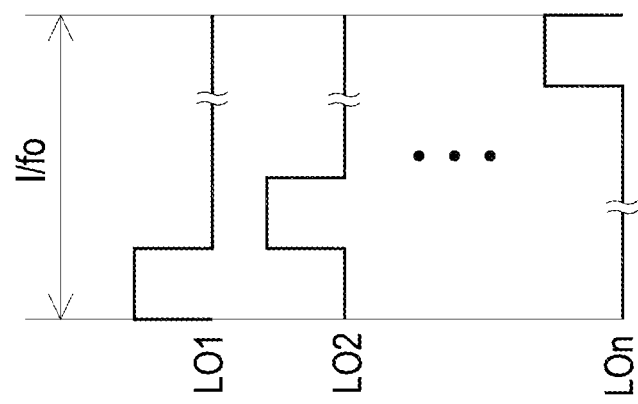
FIG. 2 is a schematic graph showing the duty ratios of the plural switches of FIG. 1.
Figure 1:
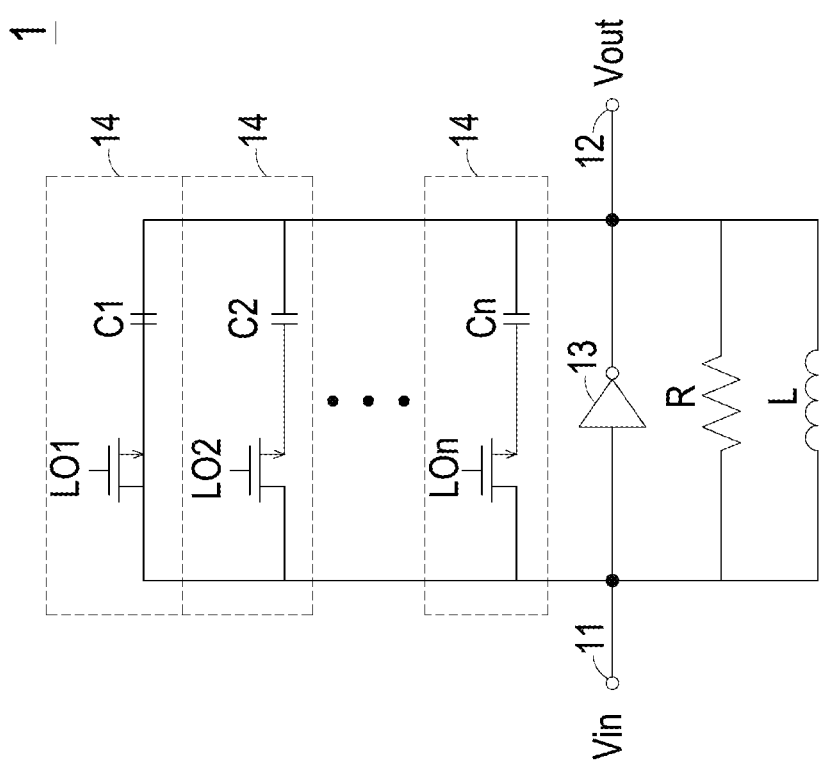
FIG. 1 is a schematic diagram illustrating a low noise amplifier according to an embodiment of the present disclosure.

FIG. 1 is a schematic diagram illustrating a low noise amplifier according to an embodiment of the present disclosure, and FIG. 2 is a schematic graph showing the duty ratios of the plural switches of FIG. 1. As shown in FIG. 1, the low noise amplifier 1 includes an input port 11, an output port 12, an inverter 13, a plurality of switched-capacitor units 14 and a feedback inductor L. There are an input voltage Vin and an output voltage Vout on the input port 11 and the output port 12 respectively. The inverter 13 is electrically connected between the input port 11 and the output port 12. Each of the plural switched-capacitor units 14 is electrically connected with the inverter 13 in parallel, every switched-capacitor unit 14 includes a switch (LO1, LO2 . . . LOn) and a capacitor (C1, C2 . . . Cn) connected in series, and n is an integer larger than 2. The plural switched-capacitor units 14 have a center frequency fo. The feedback inductor L is electrically connected with the inverter 13 in parallel. In an embodiment, the low noise amplifier 1 further includes a resistance R electrically connected with the inverter 13 in parallel.

As shown in FIG. 2, the plural switches (LO1, LO2 . . . LOn) are turned on at different times separately with the same duty ratio, and the sum of the plural duty ratios is 100%. The cycle time equals 1/fo. For example, if there are four switched-capacitor units 14, every switch (LO1, LO2, LO3 and LO4) is turned on at different times with 25% duty ratio, and the sum of the duty ratios of four switches LO1, LO2, LO3 and LO4 is 100%.

Please refer to FIGS. 3A and 3B. FIGS. 3A and 3B are schematic diagrams illustrating equivalent circuits of the low noise amplifier of FIG. 1. Ideally, a work frequency of the low noise amplifier 1 is equal to the center frequency fo of the plural switched-capacitor units 14. However, in fact, the low noise amplifier 1 unavoidably includes a plurality of parasitic capacitors (Cp,in, Cp,out and Cp,f), and the plural switched-capacitor units 14 are equivalent to an Rp-Lp-Cp parallel network in series with the resistance Rsw. The plural parasitic capacitors (Cp,in, Cp,out and Cp,f) cause the decrease of the work frequency especially when the low noise amplifier 1 works at high frequency (e.g., over 5 GHz). Accordingly, the low noise amplifier 1 of the present disclosure utilizes the feedback inductor L to balance the affection of the parasitic capacitors (Cp,in, Cp,out and Cp,f). Since the feedback inductor L is connected with the plural switched-capacitor units 14 in parallel, the center frequency of the feedback inductor L and the switched-capacitor units 14 is higher than the frequency fo. With a proper value of the inductance of the feedback inductor L, the affection of the parasitic capacitor (Cp,in, Cp,out and Cp,f) is balanced, and the work frequency of the low noise amplifier 1 is shifted to the center frequency fo. Therefore, the frequency offset is eliminated, and the performance of the low noise amplifier 1 is improved. Meanwhile, the feedback inductor L itself makes negligible noise contribution with a high quality factor. The higher the quality factor of the feedback inductor L, the larger its equivalent resistance and the less its noise contribution. In addition, the center frequency fo of the switched-capacitor units 14 is calculated by the formula (1), and the equivalent impedance Z is calculated by the formula (2).

$$f_0 = \frac{1}{2\pi\sqrt{L_p C_p}} \quad (1)$$

$$Z = R \left\| \frac{1}{sC_{p,f}} \right\| \left( R_{sw} + \frac{1}{\frac{1}{R_p} + sC_p + \frac{1}{sL_p}} \right) \| sL \quad (2)$$

where s is the complex frequency.

Figure 4:
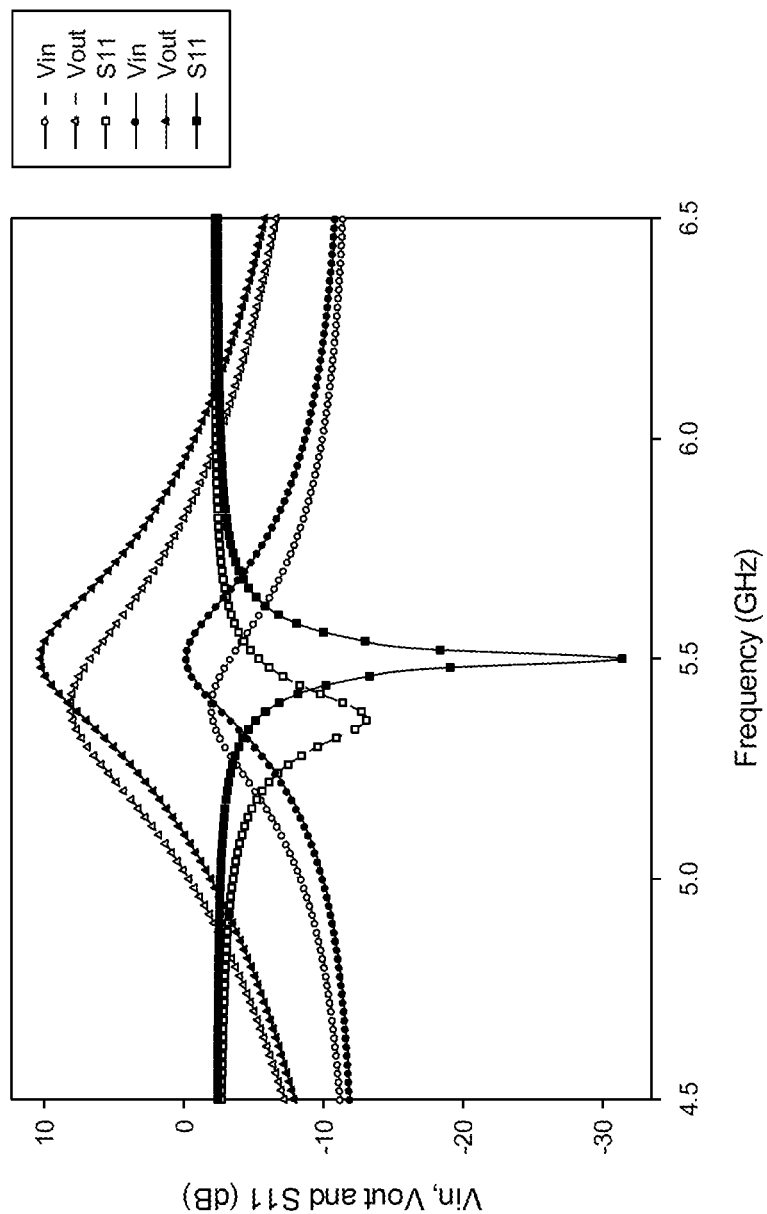
FIG. 4 is a schematic graph showing the input voltage, the output voltage and the return loss of the low noise amplifier of FIG. 1 compared with that of the low noise amplifier without the feedback inductor.
Figure 5:
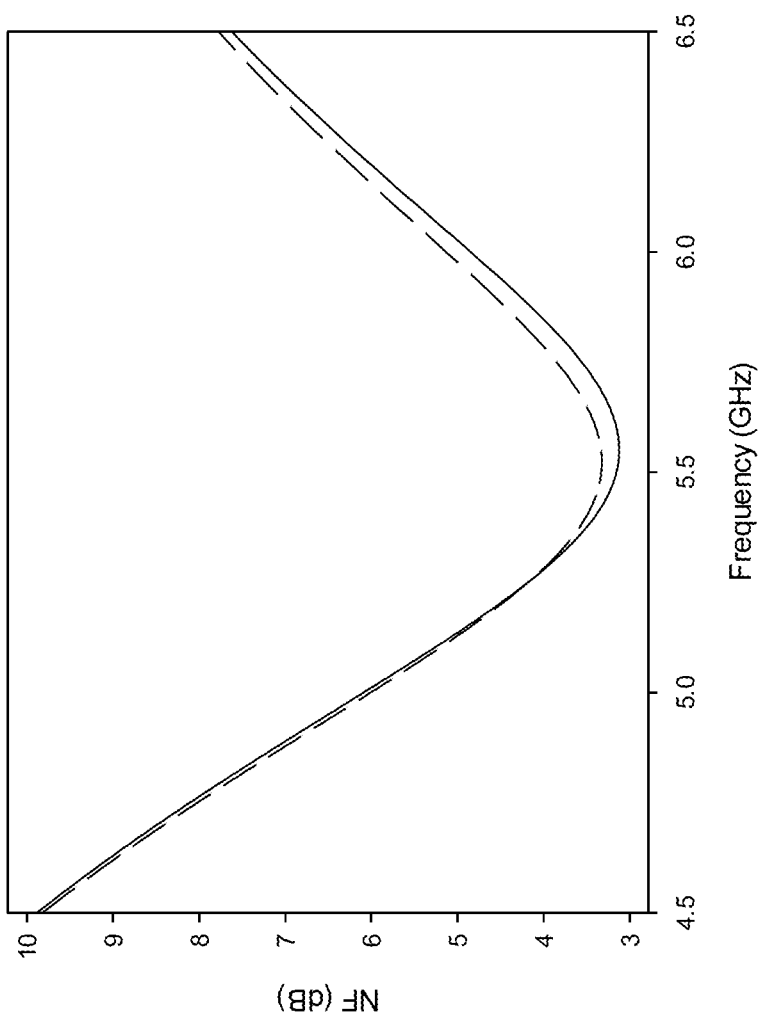
FIG. 5 is a schematic graph showing the noise figure of the low noise amplifier of FIG. 1 compared with that of the low noise amplifier without the feedback inductor.

FIG. 4 is a schematic graph showing the input voltage, the output voltage and the return loss of the low noise amplifier of FIG. 1 compared with that of the low noise amplifier without the feedback inductor, and FIG. 5 is a schematic graph showing the noise figure of the low noise amplifier of FIG. 1 compared with that of the low noise amplifier without the feedback inductor. In FIGS. 4 and 5, the simulation results of the input voltage Vin, the output voltage Vout, the return loss S11 and the noise figure NF are shown. The simulation results of the low noise amplifier 1 with the feedback inductor L are depicted by solid lines (with solid symbol in FIG. 4), and the simulation results of the low noise amplifier without the feedback inductor L are depicted by dash lines (with hollow symbol in FIG. 4). In this embodiment, the center frequency fo is 5.5 GHz, and the number of the switched-capacitor units 14 is four. Moreover, Table 1 shows the center-frequency offset of the simulation results and the value of the simulation results at the center frequency fo of 5.5 GHz. As shown in FIG. 4 and Table 1, regarding the low noise amplifier without the feedback inductor L, there is around 100 MHz center-frequency offset downwards for the input voltage Vin and the output voltage Vout, and even more for the return loss S11. Regarding the low noise amplifier 1 with the feedback inductor L, all of them are recentered to be exactly same with the center frequency fo. Namely, the center frequencies of the input voltage Vin, the output voltage Vout, the return loss S11 and the noise figure NF of the low noise amplifier 1 are equal to the center frequency fo of the plural switched-capacitor units 14. In addition, as shown in FIG. 5 and Table 1, compared with the noise figure NF of the low noise amplifier without the feedback inductor L, the noise figure NF of the low noise amplifier 1 with the feedback inductor L is improved by around 0.2 dB. Consequently, the gain and the signal-to-noise ratio (SNR) of the low noise amplifier 1 are improved.

TABLE 1 the center-frequency offset of the simulation results and the value of the simulation results at the center frequency of 5.5 GHz

| | Without L | | With L | |
|---|---|---|---|---|
| | Offset (MHz) | Value (dB) | Offset (MHz) | Value (dB) |
| Vout | 108 | 6.67 | <1 | 10.3 |
| Vin | 108 | -3.4 | <3 | -0.2 |
| S11 | 130 | -5.3 | <2 | -30 |
| NF | / | 3.33 | / | 3.15 |

From the above descriptions, the present disclosure provides a low noise amplifier. In the low noise amplifier, the feedback inductor is electrically connected with the inverter and the plural switched-capacitor units in parallel. The affection of the parasitic capacitors is balanced by the feedback inductor, and thus the work frequency of the low noise amplifier is kept equal to the center frequency of the plural switched-capacitor units. Consequently, the self correction function for frequency offset is realized, and the low noise amplifier is allowed to work at high frequency.

While the disclosure has been described in terms of what is presently considered to be the most practical and preferred embodiments, it is to be understood that the disclosure needs not be limited to the disclosed embodiment.

What is claimed is:

1. A low noise amplifier, comprising:
   an input port;
   an output port;
   an inverter electrically connected between the input port and the output port;
   a plurality of switched-capacitor units, wherein each of the plural switched-capacitor units is electrically connected with the inverter in parallel and comprises a switch and a capacitor connected in series, the plural switches are turned on at different times separately, the sum of a plurality of duty ratios of the plural switches is 100%, wherein the low noise amplifier has a work frequency, and the plural switched-capacitor units have a center frequency;
   a plurality of parasitic capacitors causing a decrease of the work frequency; and
   a feedback inductor electrically connected with the inverter in parallel, wherein the feedback inductor causes an increase of the work frequency, and the increase and the decrease are equal in magnitude so as to make the work frequency equal to the center frequency.

2. The low noise amplifier according to claim 1, wherein the plurality of duty ratios of the plural switches are the same.

3. The low noise amplifier according to claim 1, wherein plural center frequencies of an input voltage, an output voltage, a return loss and a noise figure of the low noise amplifier are equal to the center frequency of the plural switched-capacitor units.

4. The low noise amplifier according to claim 1, wherein the work frequency and the center frequency are larger than 5 GHz.

5. The low noise amplifier according to claim 1, wherein the work frequency and the center frequency can be larger than 5 GHz.

* * * * *